United States Patent
Hata (10) Patent No.: US 7,348,601 B2
(45) Date of Patent: Mar. 25, 2008

(54) NITRIDE-BASED COMPOUND SEMICONDUCTOR LIGHT EMITTING DEVICE

(75) Inventor: Toshio Hata, Mihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 170 days.

(21) Appl. No.: 11/216,547

(22) Filed: Aug. 30, 2005

(65) Prior Publication Data

US 2006/0043405 A1 Mar. 2, 2006

(30) Foreign Application Priority Data

Aug. 31, 2004 (JP) ............... 2004-252500

(51) Int. Cl.
*H01L 29/22* (2006.01)
(52) U.S. Cl. .......................................... 257/94; 257/99
(58) Field of Classification Search ........ 257/E33.025, 257/E33.033, E33.034, E33.045, E33.046, 257/E33.054, E33.064, E33.099, E33.105, 257/E27.049, E29.22, E29.344, E29.341, 257/E29.34, E29.336, E21.006, 46, 480, 257/624, 656
See application file for complete search history.

(56) References Cited

U.S. PATENT DOCUMENTS

| | | | |
|---|---|---|---|
| 6,197,609 B1 * | 3/2001 | Tsutsui et al. ............. | 438/33 |
| 6,320,206 B1 * | 11/2001 | Coman et al. ............. | 257/94 |
| 6,562,648 B1 * | 5/2003 | Wong et al. ............... | 438/46 |
| 6,613,461 B1 * | 9/2003 | Sugahara ................... | 428/698 |
| 6,727,518 B2 * | 4/2004 | Uemura et al. ............ | 257/79 |
| 6,800,500 B2 * | 10/2004 | Coman et al. ............. | 438/22 |
| 2006/0017060 A1 * | 1/2006 | Chen et al. ................ | 257/99 |
| 2006/0043387 A1 * | 3/2006 | Hata ......................... | 257/79 |
| 2006/0046328 A1 * | 3/2006 | Raffetto et al. ........... | 438/21 |
| 2006/0231852 A1 * | 10/2006 | Kususe et al. ............. | 257/99 |

FOREIGN PATENT DOCUMENTS

| JP | 09-008403 A | 1/1997 |
|---|---|---|
| JP | 2004-266240 A | 9/2004 |

* cited by examiner

*Primary Examiner*—Zandra V. Smith
*Assistant Examiner*—Swapneel Chhaya
(74) *Attorney, Agent, or Firm*—Morrison & Foerster LLP (57) ABSTRACT

A nitride-based compound semiconductor light emitting device has a first ohmic electrode, a first bonding metal layer, a second bonding metal layer and a second ohmic electrode provided in this order on a conductive substrate, and also has a nitride-based compound semiconductor layer provided on the second ohmic electrode. A surface of the second ohmic electrode is exposed.

19 Claims, 10 Drawing Sheets

NITRIDE-BASED COMPOUND SEMICONDUCTOR LIGHT EMITTING DEVICE

This nonprovisional application is based on Japanese Patent Application No. 2004-252500 filed with the Japan Patent Office on Aug. 31, 2004, the entire contents of which are hereby incorporated by reference.

BACKGROUND OF THE INVENTION

1. Field of the Invention

The present invention relates to a nitride-based compound semiconductor light emitting device (laser or light-emitting diode) capable of emitting light in the green to ultraviolet range, and more particularly to a nitride-based compound semiconductor light emitting device having a part of an ohmic electrode or a P-type semiconductor layer exposed.

2. Description of the Background Art

Figure 13:
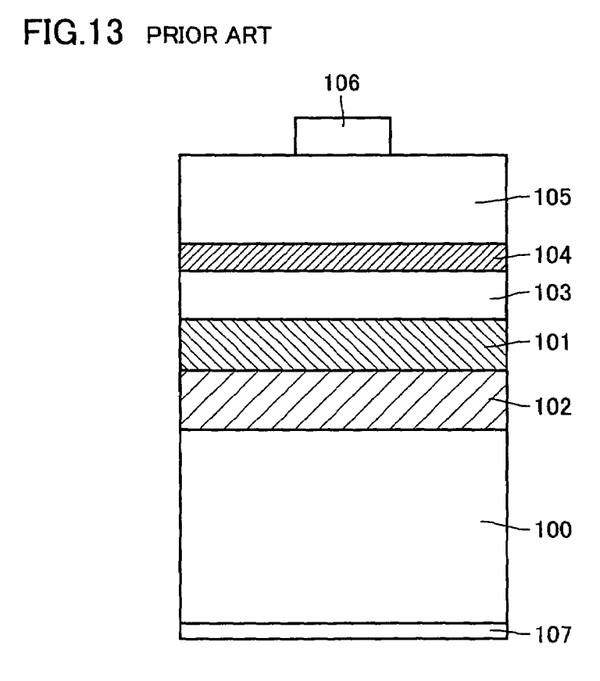
FIG. 13 is a schematic cross sectional view of a conventional nitride-based compound semiconductor light emitting device.

Japanese Patent Laying-Open No. 09-008403 discloses a nitride-based compound semiconductor light emitting device as shown in FIG. 13, wherein on a conductive substrate 100 having a positive electrode 107 formed, a first ohmic electrode 102 and a second ohmic electrode 101 are formed. A P-type layer 103 of gallium nitride-based semiconductor, a light emitting layer 104, an N-type layer 105, and a negative electrode 106 are stacked successively thereon, and first ohmic electrode 102 and second ohmic electrode 101 are bonded together by hot pressure bonding.

In the nitride-based compound semiconductor light emitting device described in Japanese Patent Laying-Open No. 09-008403, P-type layer 103 of gallium nitride-based semiconductor, light emitting layer 104 and N-type layer 105 are scribed or divided at one time. This poses a problem that a short circuit may occur on the side surfaces of P-type layer 103, light emitting layer 104 and N-type layer 105, leading to degradation in reliability of the nitride-based compound semiconductor light emitting device.

Further, when the wafer is divided into chips, there may occur peeling between first ohmic electrode 102 and second ohmic electrode 101, causing decrease in yield of the process.

Still further, if peeing occurs partially, it will cause penetration of solvent, resist, or etchant during the process. For example, upon fabrication of a lamp light emitting device, resin, water or the like will enter through the peeled-off part, which will expand the peeling, possibly destroying the ohmic electrode as well as the bonding electrode. This would degrade reliability of the nitride-based compound semiconductor light emitting device.

SUMMARY OF THE INVENTION

The present invention has been made to solve the above-described problems of the conventional techniques, and an object of the present invention is to provide a nitride-based compound semiconductor light emitting device having favorable characteristics and ensuring high reliability, by suppressing peeling at the time of chip division in the fabricating process of the nitride-based compound semiconductor light emitting device and also suppressing a short circuit in the semiconductor layer.

According to an aspect of the present invention, a nitride-based compound semiconductor light emitting device has a first ohmic electrode, a first bonding metal layer, a second bonding metal layer and a second ohmic electrode provided in this order on a conductive substrate, and also has a nitride-based compound semiconductor layer provided on the second ohmic electrode, wherein a surface of the second ohmic electrode is exposed.

Preferably, the nitride-based compound semiconductor layer includes at least a P-type layer, a light emitting layer and an N-type layer.

According to another aspect of the present invention, a nitride-based compound semiconductor light emitting device has a first ohmic electrode, a first bonding metal layer, a second bonding metal layer and a second ohmic electrode provided in this order on a conductive substrate, and also has a nitride-based compound semiconductor layer provided on the second ohmic electrode, wherein the nitride-based compound semiconductor layer includes at least a P-type layer, a light emitting layer and an N-type layer, and a surface of the P-type layer is exposed.

Preferably, the conductive substrate is a semiconductor of at least one kind selected from the group consisting of Si, GaAs, GaP, Ge and InP.

Preferably, the nitride-based compound semiconductor layer is formed using a support substrate, and the support substrate is either an insulative substrate of sapphire, spinel or lithium niobate, or a conductive substrate of silicon carbide, silicon, zinc oxide or gallium arsenide.

Preferably, a plane of the first bonding metal layer perpendicular to its thickness direction has an area that is greater than an area of a plane of the light emitting layer perpendicular to its thickness direction.

Preferably, the surface of the second ohmic electrode is exposed by etching.

Still preferably, the surface of the second ohmic electrode has a width of not less than 1 µm and not more than 100 µm.

Preferably, the surface of the P-type layer is exposed by etching.

Still preferably, the surface of the P-type layer has a width of not less than 1 µm and not more than 100 µm.

Preferably, a groove is formed from the exposed surface of the second ohmic electrode, and the nitride-based compound semiconductor light emitting device is fabricated by performing dividing along the groove.

Alternatively, a groove may be formed from the exposed surface of the P-type layer, and the nitride-based compound semiconductor light emitting device is fabricated by performing dividing along the groove.

Preferably, the groove is formed down to a middle of the conductive substrate.

Preferably, the groove has a width of not less than 1 µm and not more than 50 µm.

Preferably, a scribe line is introduced from a back side of the conductive substrate, opposite to the groove formed down to the middle of the conductive substrate.

Preferably, the nitride-based compound semiconductor light emitting device is fabricated by performing dividing along the groove formed down to the middle of the conductive substrate and the scribe line introduced from the back side of the conductive substrate.

According to the present invention, it is configured such that scribing or dividing is not conducted in the vicinity of the PN junction in the semiconductor layer. That is, the groove is formed only after completely removing the nitride-based compound semiconductor layer or after removing down to the middle of the P-type layer. This can prevent a short circuit between the P-type layer and the N-type layer that would otherwise occur at the time of scribing in the chip dividing step, so that the leakage current can be reduced.

Accordingly, it is possible to provide a highly reliable nitride-based compound semiconductor light emitting device.

Further, when forming the groove from the exposed surface, peeling or separation of the bonding metal layer is prevented, thereby facilitating chip dividing. This improves the yield of the light emitting devices, and thus, an inexpensive nitride-based compound semiconductor light emitting device can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention provides a nitride-based compound semiconductor light emitting device having a first ohmic electrode, a first bonding metal layer, a second bonding metal layer and a second ohmic electrode stacked in this order on a conductive substrate, and also having a nitride-based compound semiconductor layer provided on the second ohmic electrode, characterized in that a surface of the second ohmic electrode is exposed.

With this configuration, the leakage current can be reduced, and a highly reliable nitride-based compound semiconductor light emitting device can be obtained. Hereinafter, the present invention will be explained in detail with reference to the drawings.

First Embodiment

Figure 1:
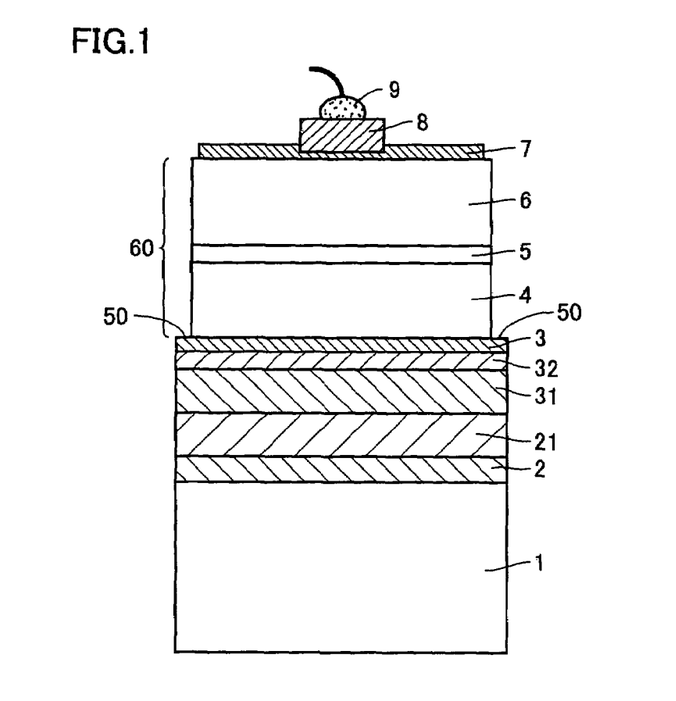
FIG. 1 is a schematic cross sectional view of a nitride-based compound semiconductor light emitting device according to the present invention.

FIG. 1 is a schematic cross sectional view of a nitride-based compound semiconductor light emitting device according to the present invention. In FIG. 1, the nitride-based compound semiconductor fight emitting device of the present invention includes at least a first ohmic electrode 2, a first bonding metal layer 21, a second bonding metal layer 31, and a second ohmic electrode 3 on a conductive substrate 1, and a nitride-based compound semiconductor layer 60 is formed on second ohmic electrode 3. Further, a transparent electrode 7, a pad electrode 8 and bonding wire 9 are formed on nitride-based compound semiconductor layer 60, to make the structure function as a light emitting device.

In the present invention, the nitride-based compound semiconductor layer has a P-type layer 4, a light emitting layer 5 and an N-type layer 6 in this order, as shown in FIG. 1. Compositions, thicknesses and physical properties of these semiconductor layers may be adjusted to achieve emission of light having desired characteristics.

In the present invention, as the conductive substrate, any substrate having good thermal conductivity, easy to form a cleavage plane, and easy to achieve conductivity of P-type or N-type, may be employed. Specifically, it is preferable to use semiconductor of at least one kind selected from the group consisting of Si, GaAs, GaP, Ge and InP, although not restricted thereto. Particularly, it is preferable to use a Si substrate from the standpoint of inexpensiveness.

In the present invention, Ti/Al, Ti, Al, Hf, Hf/Al and the like may be used for the first ohmic electrode. Among them, Ti/Al is most preferable since a light emitting device of a low operating voltage can be fabricated. Pd, Ni, Pd/Au, Ni/Au, Ag and the like may be used for the second ohmic electrode. Among them, Pd is most preferable from the standpoint of fabricating the light emitting device of a low operating voltage.

Further, in the present invention, Au, AuSn, Sn, In, In—Pd, Ag paste, AuGe and the like may be used for the first and second bonding metal layers, although not restricted thereto.

Still further, in the present invention, for the nitride-based compound semiconductor layer, nitride-based compound semiconductor including at least one of $In_xAl_yGa_{1-x-y}$ ($0 \leq x$, $0 \leq y$, $x+y \leq 1$), P, As, B and the like may be used, although not restricted thereto.

Hereinafter, a fabricating method of a nitride-based compound semiconductor light emitting device according to the present invention will be explained with reference to the drawings. It is noted that dimensions of the respective layers indicated in the following explanation are merely by way of example, and they may be adjusted as appropriate in accordance with desired properties of the light emitting device.

Figure 2:
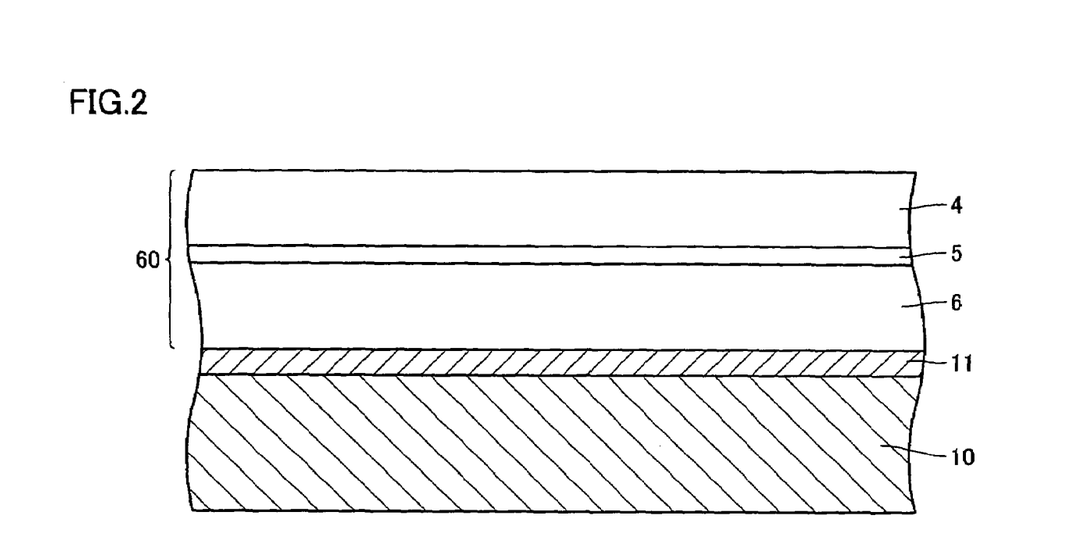
FIG. 2 is a schematic cross sectional view illustrating a step of forming a semiconductor layer on a support substrate in a fabricating process of a nitride-based compound semiconductor light emitting device according to the present invention.

Firstly, as shown in FIG. 2, a buffer layer 11 of a GaN material, an N-type nitride-based compound semiconductor layer 6, a light emitting layer 5 of a multi-quantum well (MQW) structure, and a P-type nitride-based compound semiconductor layer 4 are formed successively on a support substrate 10, by metallorganic chemical vapor deposition (MOCVD), for example.

In the present invention, as the support substrate, an insulative substrate such as sapphire, spinel or lithium niobate, or a conductive substrate such as silicon carbide, silicon, zinc oxide or gallium arsenide may be used.

As for the dimensions of the layers, by way of example, support substrate 10 may be 430 µm thick, GaN buffer layer 11 may be 20 nm thick, N-type nitride-based compound semiconductor layer may be 5 µm thick, MQW light emitting layer 5 may be 50 nm thick, and P-type nitride-based compound semiconductor layer 4 may be 200 nm thick, although they are not restricted thereto.

Figure 3:
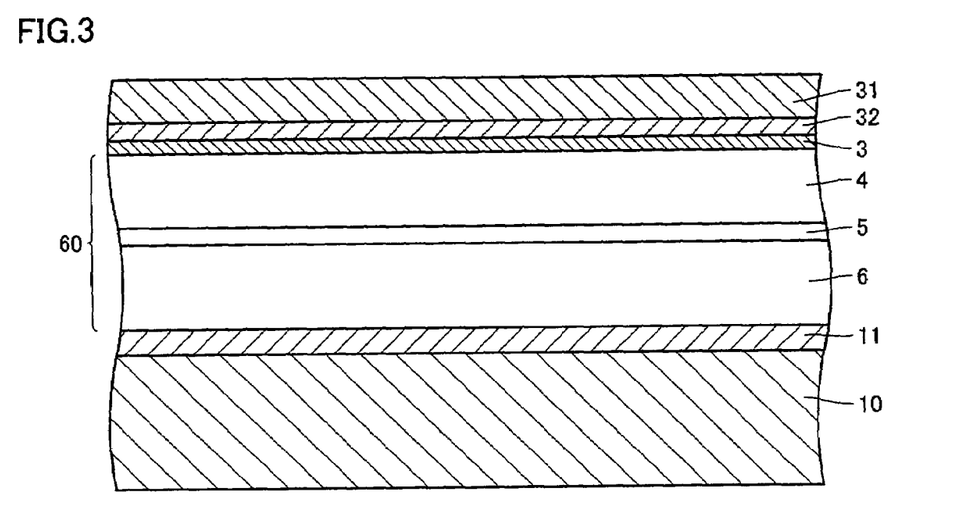
FIG. 3 is a schematic cross sectional view illustrating a step of forming an ohmic electrode and a bonding metal layer on the semiconductor layer in the fabricating process of the nitride-based compound semiconductor light emitting device of the present invention.

Next, as shown in FIG. 3, on P-type nitride-based compound semiconductor layer 4, a second ohmic electrode 3, a reflecting metal layer 32, and a second bonding metal layer 31 are formed by evaporation. For the second ohmic electrode, electron beam (EB) evaporation ensuring good controllability of film thickness may be employed under the condition of 0.4 Å/sec. Reflecting metal layer 32 is preferably formed by sputtering, and second bonding metal layer 31 is preferably formed by resistive thermal evaporation.

Second ohmic electrode 3 may be formed of a Pd material to a thickness of 3 nm. Reflecting metal layer 32 may be formed of an Ag material to a thickness of 150 nm. As second bonding metal layer 31, an AuSn material may be used to form a 3 µm thick layer and an Au material may be used to form a 100 nm thick layer, in this order. It is preferable that a Mo material is used to form a barrier layer (not shown) to a thickness of 100 nm between reflecting metal layer 32 and second bonding metal layer 31. Here, Sn contained in AuSn is preferably 20 mass %. When the second bonding metal layer of AuSn/Au is employed, Au on AuSn functions as an antioxidant film of the AuSn layer.

Figure 4:
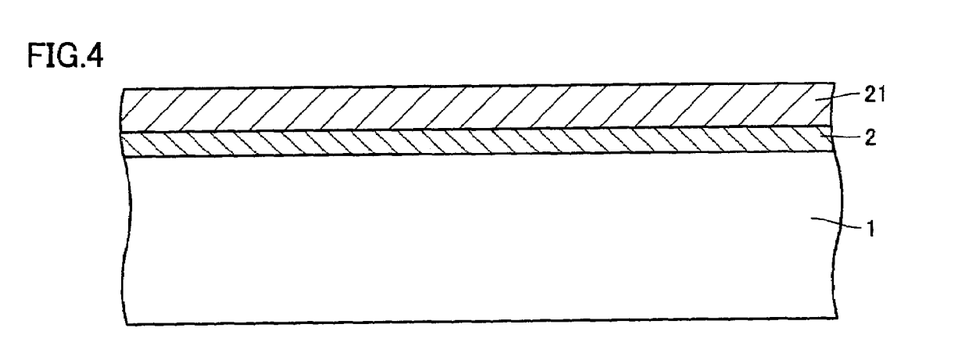
FIG. 4 is a schematic cross sectional view illustrating a step of forming an ohmic electrode and a bonding metal layer on a conductive substrate in the fabricating process of the nitride-based compound semiconductor light emitting device of the present invention.

Next, as shown in FIG. 4, a first ohmic electrode 2 and a first bonding metal layer 21 are formed in this order on a conductive substrate 1. Preferably, first ohmic electrode 2 is formed using EB evaporation, and first bonding metal layer 21 is formed using resistive thermal evaporation. The conductive substrate may be formed of a Si material to a thickness of 350 µm. First ohmic electrode 2 may be formed of Ti/Al, to thicknesses of 15 nm/150 nm, respectively. First bonding metal layer 21 may be formed of an Au material to a thickness of 3 µm. A barrier layer (not shown) of a Mo material may be formed to a thickness of 100 nm between first ohmic electrode 2 and first bonding metal layer 21.

Figure 5:
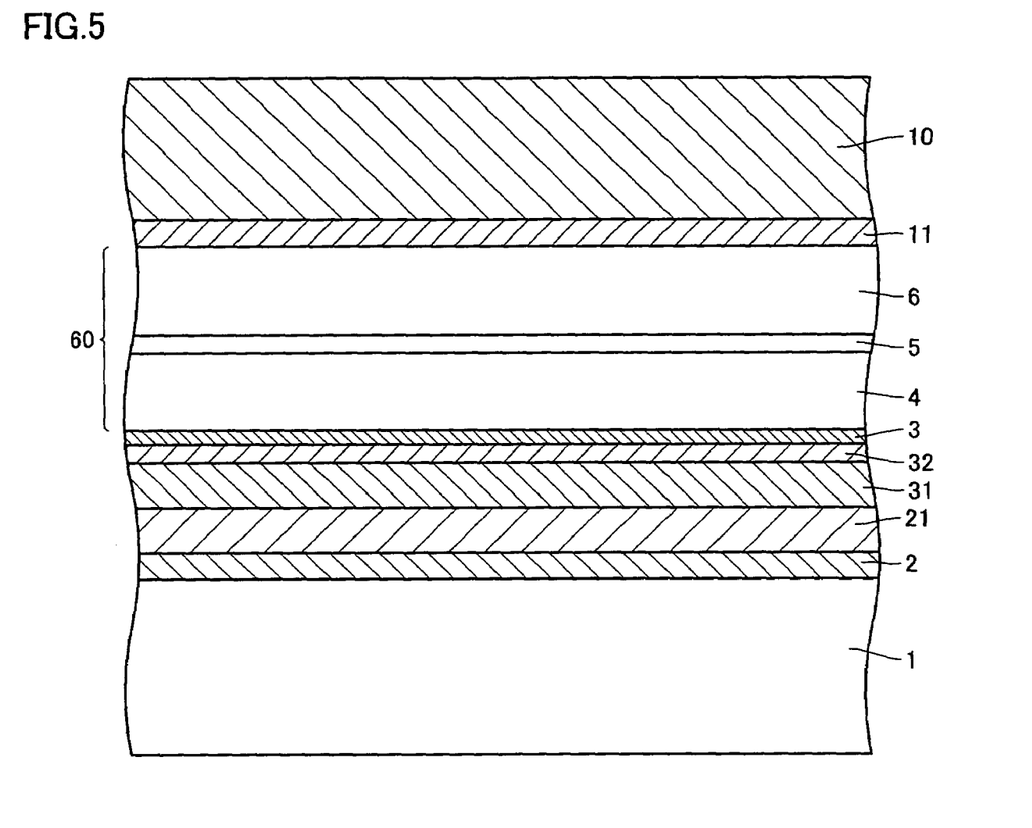
FIG. 5 is a schematic cross sectional view illustrating a step of bonding the structure of FIG. 3 and the structure of FIG. 4 in the fabricating process of the nitride-based compound semiconductor light emitting device of the present invention.

Next, as shown in FIG. 5, the structure shown in FIG. 3 and the structure shown in FIG. 4 are bonded such that second bonding metal layer 31 and first bonding metal layer 21 are bonded to each other. Specifically, the Au layer as first bonding metal layer 21 and the Au layer on the AuSn layer as second bonding metal layer 31 are made to face each other to bond them together by eutectic bonding at a temperature of 290° C. and a pressure of 300 N/cm².

Figure 6:
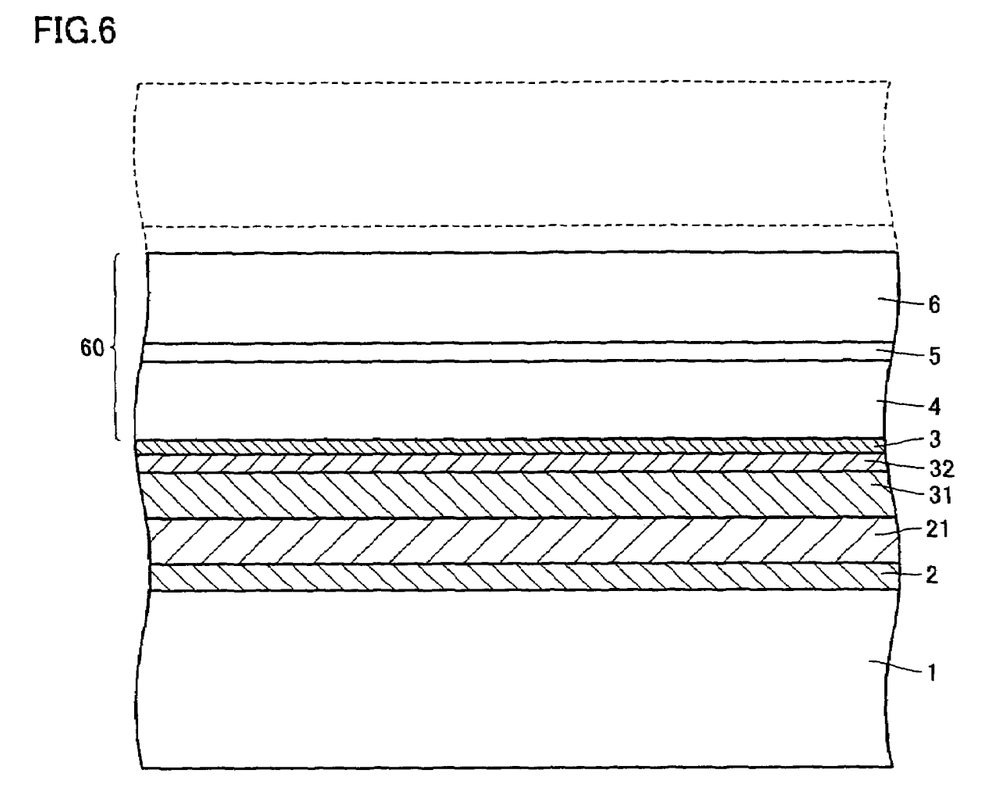
FIG. 6 is a schematic cross sectional view illustrating a step of removing the support substrate in the fabricating process of the nitride-based compound semiconductor light emitting device of the present invention.

Next, as shown in FIG. 6, support substrate 10 is removed. Specifically, YAG-THG laser light (of 355 nm in wavelength) is irradiated from the mirror-finished side of support substrate 10, for thermal decomposition of support substrate 10, buffer layer 11 of the GaN material forming the interface with support substrate 10, and a part of N-type layer 6 of the N-type GaN material, to thereby remove support substrate 10. In FIG. 6, the broken lines indicate support substrate 10, buffer layer 11 and a part of N-type layer 6 thus removed.

Figure 7:
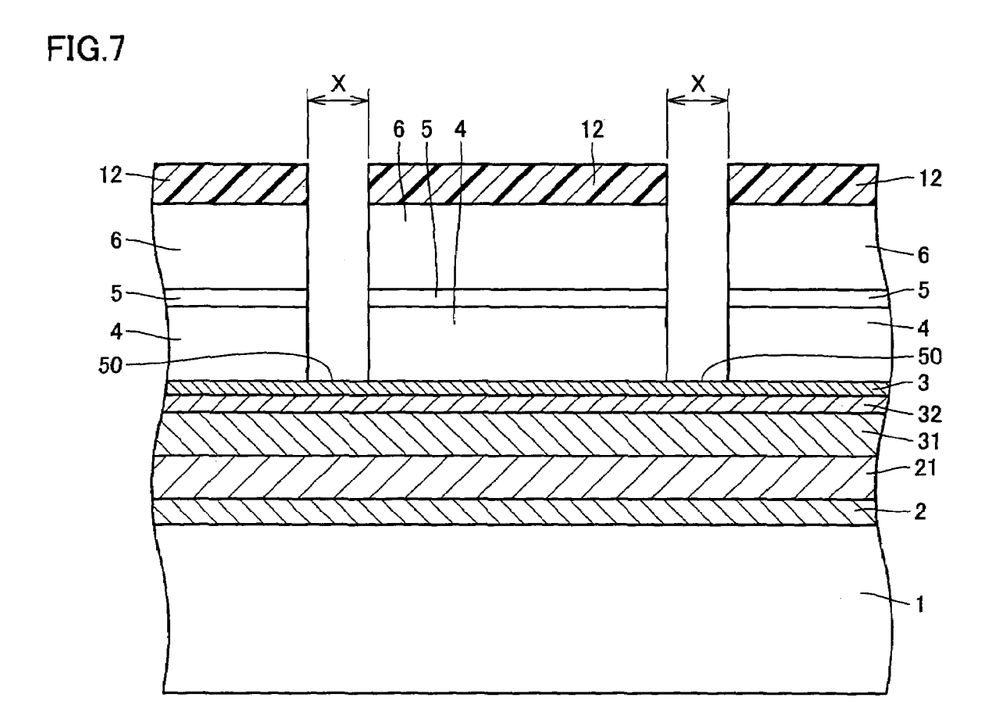
FIG. 7 is a schematic cross sectional view illustrating a step of exposing a surface of the ohmic electrode by etching in the fabricating process of the nitride-based compound semiconductor light emitting device of the present invention.

Next, as shown in FIG. 7, a resist 12 is formed on N-type layer 6, and reactive ion etching (RIE) is used to form a groove by completely removing from N-type layer 6 to P-type layer 4 to thereby expose a main surface 50 of second ohmic electrode 3. Here, the groove exposed by RIE has a width X of preferably not less than 1 µm and not more than 100 µm. If it is less than 1 µm, formation of a groove for dividing the wafer into chips at the surface of the exposed groove becomes difficult, in which case chip dividing may not be carried out successfully. If it exceeds 100 µm, the groove becomes unnecessary wide, in which case the number of chips obtainable from a single wafer decreases. More preferably, width X is not less than 10 µm and not more than 30 µm, and it is 50 µm in the first embodiment.

Figure 8:
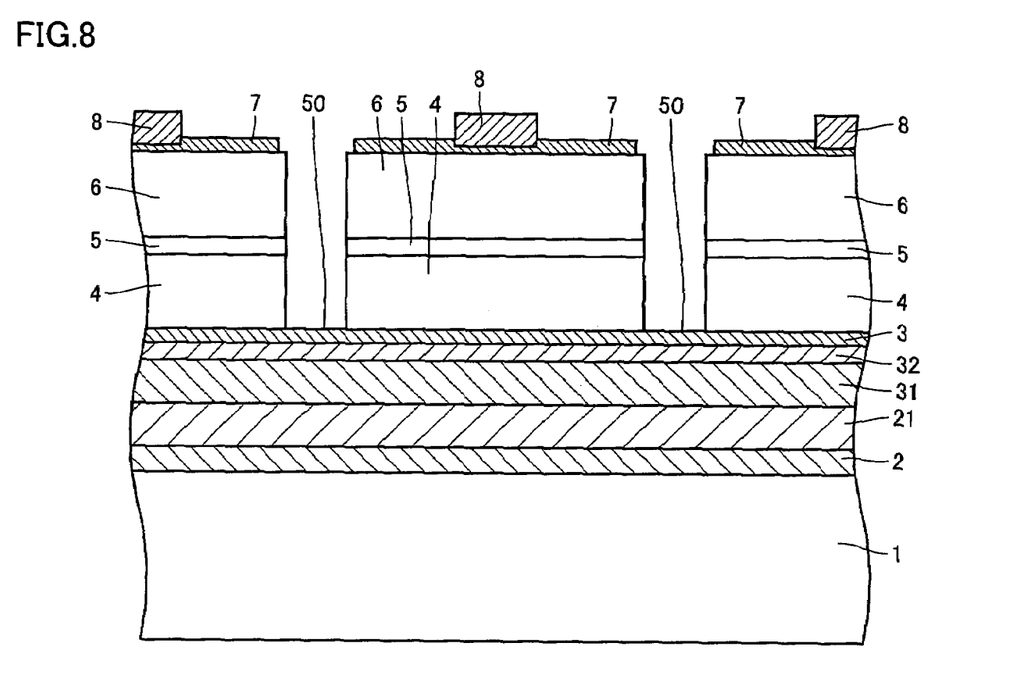
FIG. 8 is a schematic cross sectional view illustrating a step of forming a transparent electrode and a pad electrode on the N-type layer in the fabricating process of the nitride-based compound semiconductor light emitting device of the present invention.

Next, as shown in FIG. 8, resist 12 is removed, and a transparent conductor electrode 7 of ITO (Sn-doped $In_2O_3$) is formed on an approximately entire surface of N-type layer 6 of the GaN material having been exposed by removal of support substrate 10, and an N-type bonding pad electrode (Au/Ti) as bonding pad electrode 8 is formed at the center of transparent conductor electrode 7.

Figure 9:
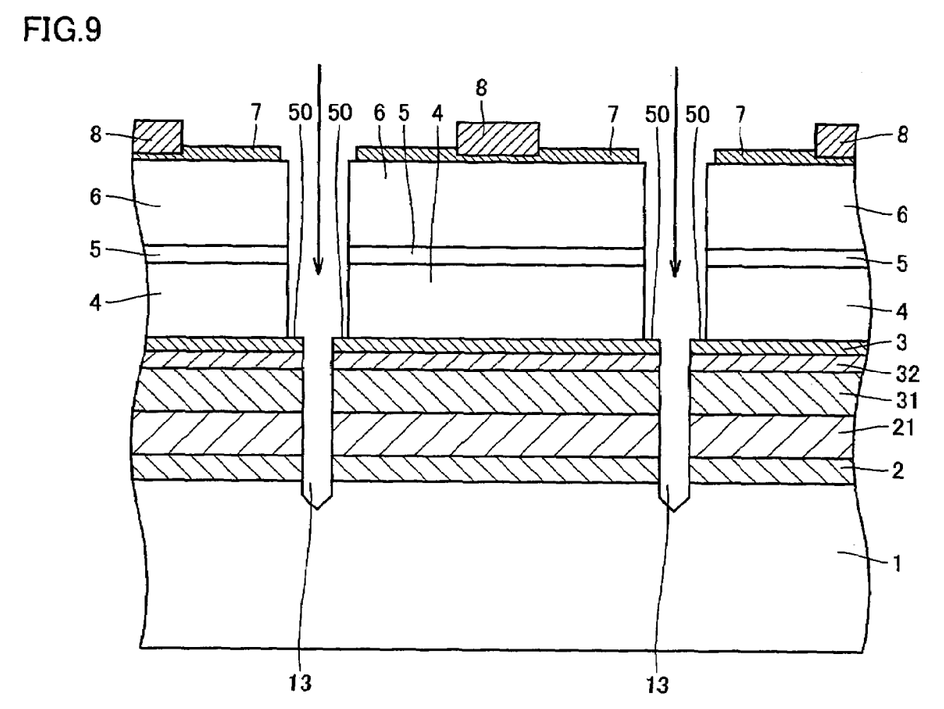
FIG. 9 is a schematic cross sectional view illustrating a step of forming a groove from the exposed surface in the fabricating process of the nitride-based compound semiconductor light emitting device of the present invention.
Figure 10:
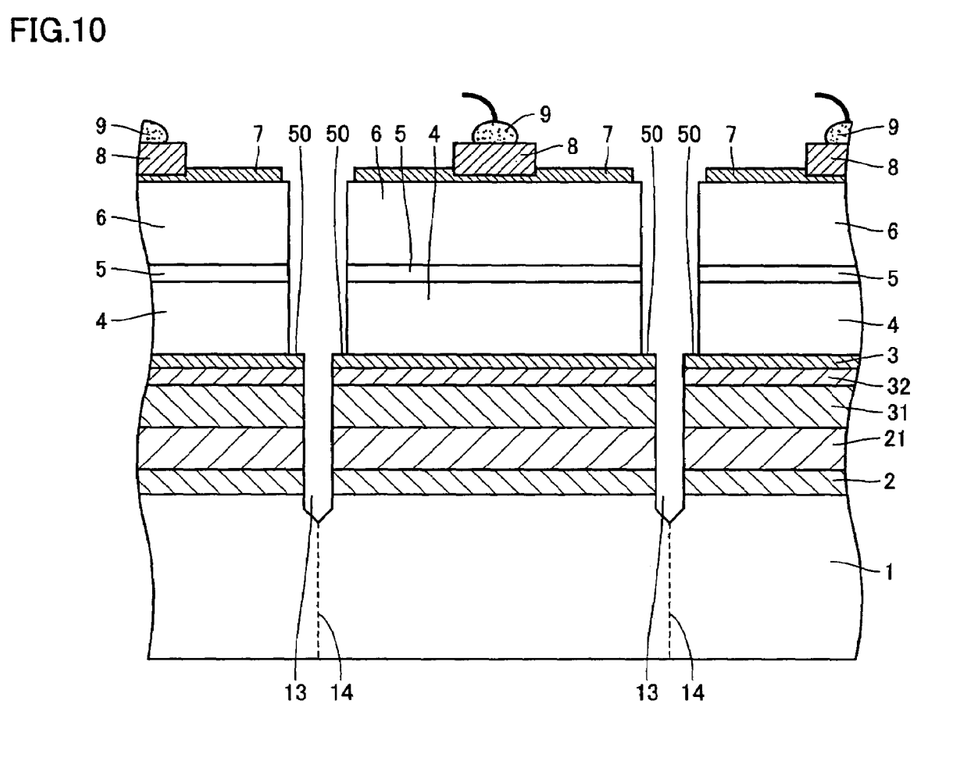
FIG. 10 is a schematic cross sectional view illustrating a step of introducing a scribe line to the groove formed from the exposed surface in the fabricating process of the nitride-based compound semiconductor light emitting device of the present invention.

Next, as shown in FIG. 9, YAG-THG laser light (of 355 nm in wavelength) is irradiated in the direction indicated by arrows, to form a groove 13 from main surface 50 of second ohmic electrode 3 down to the middle of conductive substrate 1. Next, as shown in FIG. 10, a scribe line 14 is formed from the back side of the conductive substrate, using a scriber of an infrared transmission type, so as to extend opposite to groove 13. When the wafer is divided along this scribe line 14, the chip dividing step is completed. Further, bonding wire 9 of an Au material is ball-bonded on bonding pad 8. As such, the nitride-based compound semiconductor light emitting device of the present invention as shown in FIG. 1 is fabricated.

As described above, according to the nitride-based compound semiconductor light emitting device of the present invention, in order to prevent scribing or dividing of the wafer near the PN junction, the nitride-based compound semiconductor layer is completely removed or removed down to the middle of the P-type layer in the region where the scribe line or the groove for chip dividing is formed. This suppresses a short circuit between the P-type layer and the N-type layer that would otherwise occur at the time of scribing in the chip dividing step, thereby reducing the leakage current. Accordingly, a highly reliable nitride-based compound semiconductor light emitting device can be realized.

Further, the groove is formed at the exposed surface of the ohmic electrode layer by laser, and the scribe line is also formed from the conductive substrate side opposite to the relevant groove. Thus, chip dividing is facilitated, with peeling or separation of the bonding metal layers suppressed, which increases the number of chips obtainable. It is noted that Si may be removed from the back side of the conductive substrate by etching before formation of scribe line 14 therefrom, in which case chip dividing is further facilitated.

Second Embodiment

The case of using other materials than in the first embodiment for respective layers in the nitride-based compound semiconductor light emitting device of the present invention will now be explained.

In the nitride-based compound semiconductor light emitting device of the present invention described in the first embodiment, reflecting metal layer 32 shown in FIG. 3 may also be formed using an Ag—Nd material to a thickness of 150 nm. Further, as second bonding metal layer 31, an AuSn material may be used to form a 3 μm thick layer and an Au material may be used to form a 10 nm thick layer in this order. Still further, the barrier layer provided between reflecting metal layer 32 and second bonding metal layer 31 may be formed using a Ni—Ti material to a thickness of 200 nm.

Moreover, in the nitride-based compound semiconductor light emitting device of the first embodiment, first bonding metal layer 21 shown in FIG. 4 may also be formed using an Au material to a thickness of 3 μm, and the barrier layer provided between first ohmic electrode 2 and first bonding metal layer 21 may be formed using a Ni—Ti material to a thickness of 200 nm.

In the case of using these materials, eutectic bonding for bonding the structure of FIG. 3 with the structure of FIG. 4 is preferably conducted under the conditions of a temperature of 270° C. and a pressure of 400 N/cm$^2$.

The process of providing a resist on N-type layer 6 and exposing the surface, as shown in FIG. 7 in the first embodiment, may be conducted in another way, which will now be explained with reference to FIG. 11.

Figure 11:
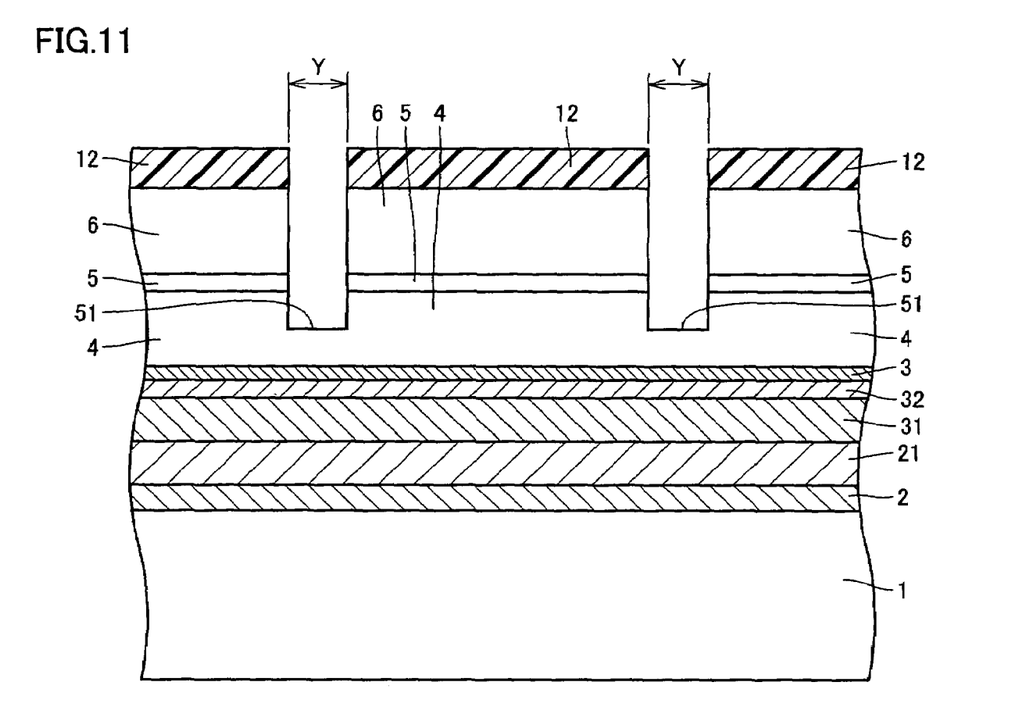
FIG. 11 is a schematic cross sectional view illustrating an alternative step corresponding to FIG. 7.

FIG. 11 is a schematic cross sectional view illustrating the step corresponding to the process of FIG. 7 in the first embodiment. In FIG. 11, up to formation of resist 12, the process is similar to that in the first embodiment, except that materials and thicknesses of the respective layers are modified as described above.

In FIG. 11, after formation of resist 12, etching, specifically RIE, is conducted using resist 12 as a mask, from the N-type layer 6 side to the middle of P-type layer 4 to thereby expose a partial surface 51 of the P-type layer. Here, the groove exposed by RIE has a width Y of preferably not less than 1 μm and not more than 100 μm. If it is less than 1 μm, formation of a groove for dividing the wafer into chips at the surface of the exposed groove becomes difficult, in which case chip dividing may not be carried out successfully. If it exceeds 100 μm, the groove becomes unnecessary wide, in which case the number of chips obtainable from a single wafer decreases. More preferably, width Y is not less than 10 μm and not more than 50 μm, and it is 30 μm in the second embodiment.

Thereafter, as in the case of the first embodiment and as shown in FIG. 8, resist 12 is removed, and a transparent conductor electrode 7 of ITO (Sn-doped $In_2O_3$) is formed on an approximately entire surface of N-type layer 6 of the GaN material having been exposed by removal of support substrate 10, and an N-type bonding pad electrode (Au/Ni) as bonding pad electrode 8 is formed at the center of transparent conductor electrode 7.

Figure 12:
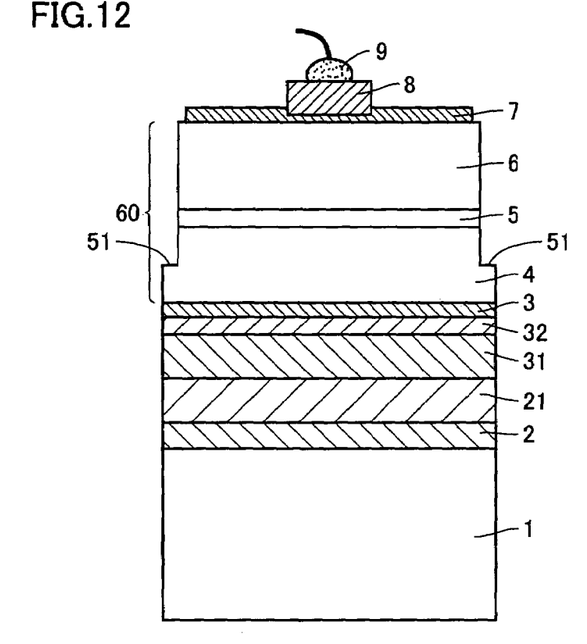
FIG. 12 is a schematic cross sectional view illustrating another embodiment of the nitride-based compound semiconductor light emitting device according to the present invention.

Next, as shown in FIG. 9, YAG-THG laser light (of 355 nm in wavelength) is irradiated in the direction indicated by arrows, to form a groove 13 from partial surface 51 of P-type layer 4 down to the middle of conductive substrate 1. Next, as shown in FIG. 10, a scribe line 14 is formed from the back side of the conductive substrate, using a scriber of an infrared transmission type, such that it extends opposite to groove 13. When the wafer is divided along this scribe line 14, the chip dividing step is completed. Further, bonding wire 9 of an Au material is ball-bonded on bonding pad 8. As such, the nitride-based compound semiconductor light emitting device of the present invention as shown in FIG. 12 is fabricated.

In the first and second embodiments, although Mo is used to form the barrier layer, alloys of Pt/Mo, Ni, Ti, W, Ni—Ti and the like may also be used for the barrier layer. Further, although transparent electrode 7 is formed on an approximately entire surface of N-type layer 6, it may be formed in the branch shape.

In the above embodiments of the present invention, the P-type layer and the second ohmic electrode have been explained as examples of the layer having its surface exposed. However, all that is needed is that an exposed surface is formed in any layer from the second ohmic electrode to the conductive substrate in the structure constituting the nitride-based compound semiconductor light emitting device. This can reduce or eliminate occurrence of a short circuit of the PN junction at the time of chip dividing. The layer of which surface is to be exposed can be controlled by adjusting formation of the groove in the process of the present invention such that it reaches the target layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nitride-based compound semiconductor light emitting device, having a first ohmic electrode, a first bonding metal layer, a second bonding metal layer and a second ohmic electrode provided in this order on a conductive substrate, and also having a nitride-based compound semiconductor layer provided on the second ohmic electrode, wherein a part of a main surface of said second ohmic electrode is exposed.

2. The nitride-based compound semiconductor light emitting device according to claim 1, wherein said nitride-based compound semiconductor layer includes at least a P-type layer, a light emitting layer and an N-type layer.

3. The nitride-based compound semiconductor light emitting device according to claim 2, wherein a plane of said first bonding metal layer perpendicular to its thickness direction has an area that is greater than an area of a plane of said light emitting layer perpendicular to its thickness direction.

4. The nitride-based compound semiconductor light emitting device according to claim 1, wherein said conductive substrate is a semiconductor of at least one kind selected from the group consisting of Si, GaAs, GaP, Ge and InP.

5. The nitride-based compound semiconductor light emitting device according to claim 1, wherein said nitride-based compound semiconductor layer is formed using a support substrate, the support substrate being an insulative substrate of sapphire, spinel or lithium niobate, or a conductive substrate of silicon carbide, silicon, zinc oxide or gallium arsenide.

6. The nitride-based compound semiconductor light emitting device according to claim 1, wherein said part of a main surface of said second ohmic electrode is exposed by etching.

7. The nitride-based compound semiconductor light emitting device according to claim 1, wherein said part of a main surface of said second ohmic electrode has a width of not less than 1 μm and not more than 100 μm.

8. The nitride-based compound semiconductor light emitting device according to claim 1, wherein a groove is formed from the exposed part of a main surface of said second ohmic electrode, and the nitride-based compound semiconductor light emitting device is fabricated by performing dividing along the groove.

9. A nitride-based compound semiconductor light emitting device, having a first ohmic electrode, a first bonding metal layer, a second bonding metal layer and a second ohmic electrode provided in this order on a conductive substrate, and also having a nitride-based compound semiconductor layer provided on the second ohmic electrode, wherein the nitride-based compound semiconductor layer includes at least a P-type layer, a light emitting layer and an N-type layer, in this order, and a part of a main surface of said P-type layer is exposed.

10. The nitride-based compound semiconductor light emitting device according to claim 9, wherein said conductive substrate is a semiconductor of at least one kind selected from the group consisting of Si, GaAs, GaP, Ge and InP.

11. The nitride-based compound semiconductor light emitting device according to claim 9, wherein said nitride-based compound semiconductor layer is formed using a support substrate, the support substrate being an insulative substrate of sapphire, spinel or lithium niobate, or a conductive substrate of silicon carbide, silicon, zinc oxide or gallium arsenide.

12. The nitride-based compound semiconductor light emitting device according to claim 9, wherein a plane of said first bonding metal layer perpendicular to its thickness direction has an area that is greater than an area of a plane of said light emitting layer perpendicular to its thickness direction.

13. The nitride-based compound semiconductor light emitting device according to claim 9, wherein said part of a main surface of said P-type layer is exposed by etching.

14. The nitride-based compound semiconductor light emitting device according to claim 9, wherein said part of a main surface of said P-type layer has a width of not less than 1 μm and not more than 100 μm.

15. The nitride-based compound semiconductor light emitting device according to claim 9, wherein a groove is formed from the exposed part of a main surface of said P-type layer, and the nitride-based compound semiconductor light emitting device is fabricated by performing dividing along the groove.

16. The nitride-based compound semiconductor light emitting device according to claim 15, wherein said groove is formed down to a middle of said conductive substrate.

17. The nitride-based compound semiconductor light emitting device according to claim 15, wherein said groove has a width of not less than 1 μm and not more than 50 μm.

18. The nitride-based compound semiconductor light emitting device according to claim 15, wherein a scribe line is introduced from a back side of said conductive substrate opposite to the groove formed down to the middle of said conductive substrate.

19. The nitride-based compound semiconductor light emitting device according to claim 18, fabricated by performing dividing along the groove formed down to the middle of said conductive substrate and the scribe line introduced from the back side of said conductive substrate.

* * * * *